(12) United States Patent
Lin

(10) Patent No.: US 6,486,563 B1
(45) Date of Patent: Nov. 26, 2002

(54) WAFER SCALE PACKAGING SCHEME

(75) Inventor: Mou-Shiung Lin, Hsinchu (TW)

(73) Assignee: Megic Corporation, Hsin-Chu (TW)

( * ) Notice: Subject to any disclaimer, the term of this patent is extended or adjusted under 35 U.S.C. 154(b) by 0 days.

(21) Appl. No.: 09/619,017

(22) Filed: Jul. 19, 2000

Related U.S. Application Data

(62) Division of application No. 09/131,429, filed on Aug. 10, 1998, now Pat. No. 6,103,552.

(51) Int. Cl.$^7$ .............................................. H01L 23/48
(52) U.S. Cl. ..................... 257/778; 257/774; 257/786
(58) Field of Search ................. 257/779, 723, 257/786, 787, 774, 778, 737

(56) References Cited

U.S. PATENT DOCUMENTS 6,028,364 A * 2/2000 Ogino et al. ................. 257/778
6,242,799 B1 * 6/2001 Horiuchi et al. ............ 257/700

OTHER PUBLICATIONS

M. Hou, "Wafer Level Packaging for CSPs", in Semiconductor International, Jul. 1998, pp. 305–308.

* cited by examiner

*Primary Examiner*—Roy Potter
(74) *Attorney, Agent, or Firm*—George O. Saile; Stephen B. Ackerman

(57) ABSTRACT

A process and a package for achieving wafer scale packaging is described. A layer of a polymeric material, such as polyimide, silicone elastomer, or benzocyclobutene is deposited on the surface of a chip. Via holes through this layer connect to the top surfaces of the studs that pass through the passivating layer of the chip. In one embodiment, the polymeric layer covers a redistribution network on a previously planarized surface of the chip. Individual chip-level networks are connected together in the kerf so that conductive posts may be formed inside the via holes through electroplating. After the formation of solder bumps, the wafer is diced into individual chips thereby isolating the individual redistribution networks. In a second embodiment, no redistribution network is present so electroless plating is used to form the posts. In a third embodiment, there is also no redistribution network but electroplating is made possible by using a contacting layer. Solder bumps attached to the posts are then formed by means of electroless plating, screen or stencil printing.

6 Claims, 6 Drawing Sheets

WAFER SCALE PACKAGING SCHEME

This application is a division of application Ser. No. 09/131,429, filed Aug. 10, 1998, now U.S. Pat. No. 6,103,552.

FIELD OF THE INVENTION

The invention relates to the general field of integrated circuit packaging with particular reference to low cost methods for packaging individual chips.

BACKGROUND OF THE INVENTION

Manufacturing techniques in use in the semiconductor industry have continued to improve in efficiency with resulting drops in cost. This is particularly true for chip manufacturing where the cost per gate continues to drop year by year. Some of this advantage is, however, offset by the somewhat slower pace at which the cost of chip packaging has been dropping. Until recently, chip manufacture and chip packaging have been treated as essentially separate technologies and advances in the former have not necessarily added value to the latter.

Recently, wafer scale packaging has been gaining in popularity. By this we mean that the entire wafer is packaged prior to its being separated into individual chips. A good example of this has been a recent publication by M. Hou "Wafer level packaging for CSPs" in Semiconductor International, July 1998 pp. 305–308. CSPs (chip scale packages) first made their appearance around 1996. Since then there have been a number of improvements exemplified by the structure described by Hou. In the process that she discusses, assembly of individual chip packages becomes an extension of the wafer fabrication line rather than a separate operation dedicated to chip packaging.

Briefly, the process that is described by Hou involves compression molding of an encapsulant onto the top surface of the full wafer. A special molding press, custom built to fit each type of wafer that is to be used, is needed and reliance is made on the ability of the solder bumps, already present on the top surface of the completed wafer, to push through the plastic and reappear at the top surface of the package. Hou notes that this approach is suited primarily to low density packages.

SUMMARY OF THE INVENTION

It has been an object of the present invention to provide a package and a process for packaging semiconductor chips.

An additional object of the invention has been that said process result in the simultaneous packaging of all chips on a single wafer at the same time.

A still further object of the invention has been that said process not require any special jigs or fixtures for its implementation.

Yet another of object of the invention has been that said process be suitable for packages having a high density of interconnections.

One more object of the invention has been that said process provide packages that are significantly cheaper than those obtained through individual chip packaging processes.

These objects have been achieved by depositing a layer of a polymeric material, such as polyimide, silicone elastomer, or benzocyclobutene on the surface of the chip. Via holes through this layer connect to the top surfaces of the studs that pass through the passivating layer of the chip. In one embodiment, the polymeric layer covers a redistribution network on a previously planarized surface of the chip. Individual chip-level networks are connected together in the kerf so that conductive posts may be formed inside the via holes through electroplating. After the formation of solder bumps, the wafer is diced into individual chips thereby isolating the individual redistribution networks. In a second embodiment, no redistribution network is present. In a third embodiment, there is also no redistribution network but electroplating is made possible by using a contacting layer. The polymeric layer then also serves as the final planarizing layer. Conductive posts are then formed in the via holes by means of electroless plating.

DESCRIPTION OF THE PREFERRED EMBODIMENTS

The present invention teaches a process and a package for encapsulating an entire wafer with a layer of a polymeric material which is applied by any of several conventional techniques such as spin coating, dipping, spraying, or as a dry film and describes several low-cost ways of establishing electrical communication between terminals at the surface of the chip and solder bumps on the outer surface of the package. We will describe two embodiments of the invention. In the first of these embodiments electroplating is used to form parts of the package but it should be understood that electroless plating may be substituted for selected subprocesses without departing from the spirit of the invention.

Figure 1A:
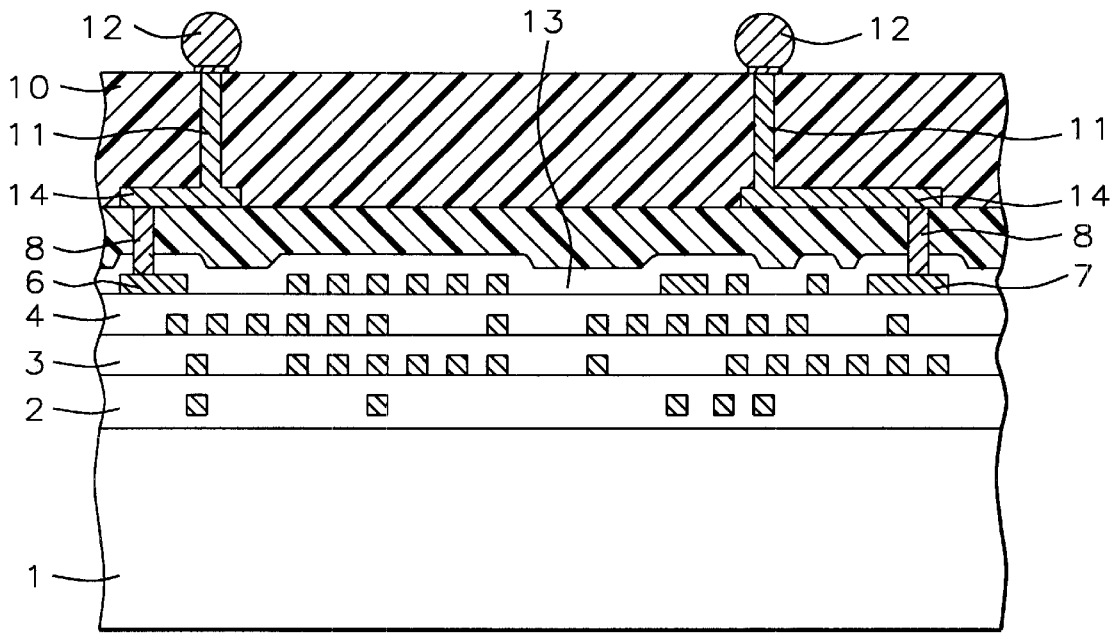
FIG. 1a is a schematic cross-section of a fully packaged integrated circuit including a top layer of polymeric material that communicates to the chip level through extended via holes and a redistribution network.

In FIG. 1a we show a schematic representation of one embodiment. An integrated circuit is shown in cross-section as a series of layers that have been formed over silicon substrate 1. Successive layers 2, 3, and 4 represent the device level and two levels of wiring respectively. Each layer has been planarized. The top-level wiring, including I/O pads such as 6 and 7 has been formed on the top surface of layer 4 and then covered by passivating layer 13 (usually silicon nitride) which in turn has been covered by a final planarizing layer 5 (typically, but not necessarily, of polyimide). In general, the pattern of studs 8 will not coincide with the pattern of solder terminals on the card or board to which the chip is to be attached. It is also possible that more than one pattern of the ball grid array (BGA) on the outer surface of the package is needed, depending on where this particular chip is to be attached. In order to deal with this, it is standard to use a redistribution network, normally located on the top surface of planarizing layer 5. A part of the redistribution network is exemplified by layer 14. An additional feature of packages of this type (not shown in FIG. 1a but illustrated in later figures) is a contacting layer at the interface between layers 5 and 10.

Using conventional manufacturing techniques, the chip manufacturing process for a standard flip chip would normally terminate at this point. In the wafer scale packaging approach, the process is continued with the application of a plastic (polymeric) layer 10 that gives the chip both environmental as well as mechanical protection. In order to be able to make electrical contact to layer 14, via holes 11, filled with a suitable conductive material, need to be formed and fresh solder bumps 12 attached to their top ends.

Figure 1B:
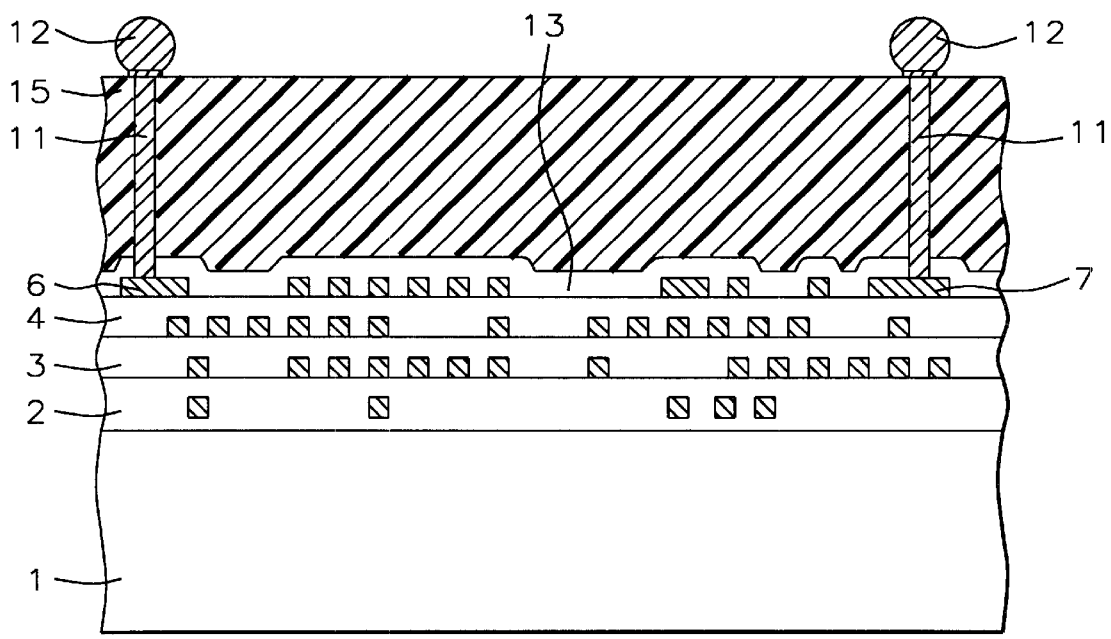
FIG. 1b is a schematic cross-section of a fully packaged integrated circuit including a top layer of polymeric material that communicates directly to the chip level through extended via holes.

FIG. 1b is a schematic view of a second embodiment, representing a lower cost version of the package. It differs from FIG. 1a in that no redistribution network is present. This implies that the pattern of connecting studs is the same as the pattern of solder terminals on the next level package. This simplification allows final planarization layer 5 (in FIG. 1a) to be omitted from the structure. Instead, polymeric layer 15 is allowed to extend all the way down to passivating layer 13.

We have identified three types of polymeric material that are suitable for wafer scale packaging of the type disclosed in the present invention. These are polyimides, silicone elastomers, and benzocyclobutene (BCB). All three types are readily applied by spin coating while in their uncured form and they may then be hardened (cured) through reaction with a hardening agent, usually, but not necessarily, accelerated by heating. Additionally, the polyimides are available in the form of dry films which can be applied directly to a surface by means of an adhesive. The choice of which material to use depends on a number of factors. These include:

Temperature coefficient of expansion (TCE)—should be low so as to match that of the metal studs, thereby minimizing local stresses at the stud-polymer interface Young's modulus (degree of inelasticity) Y—should be low to reduce transmission of stress to the posts and to decouple the thermal mismatch between silicon and plastic Water absorption—should be low to ensure stability Moisture permeability—should be low to protect the semiconductor Adhesion—should be high Electrical properties, such as dielectric constant, dielectric loss, resistivity, etc. tend to be adequate for all three of these materials.

It is thus apparent that selection of the correct polymeric material will depend on a number of factors such as layer thickness, anticipated temperature range during life, atmosphere to which package will be exposed, BGA density, chip size, I/O count, etc. Additionally, as noted below, use of the photosensitive versions of these materials offer several advantages, including the ability to tailor the shape of the via holes, so when such versions are readily available commercially (as in the case of polyimides and BCB) this must also be considered.

In TABLE I below we summarize some of the properties of these materials.

The numbers given represent averages for the class of materials:

TABLE I

| PROPERTY | POLYIMIDES | ELASTOMERS | BCB |
| --- | --- | --- | --- |
| Cure temperature | 350° C. | room temperature | 250° C. |
| Young's modulus | 3.4 Gpa | very small | 2 GPa |
| Water absorption | 3% | low | 0.2% |
| TCE | 40 × 10$^{-6}$/° C. | 1 × 10$^{-6}$/° C. | 52 × 10$^{-6}$/° C. |
| Adhesion | fair to good | Good–excellent | Fair to good |

Even if the polymeric layer is able to absorb stress inherent to the design without, for example, cracking, it is also necessary for the metal posts that fill the via holes to exhibit good elastic behavior so that, if need be, they can bend rather than break. It can be shown that a metal post of length L, fixed at one end and free at the other, requires a force F to displace it by an amount d at the free end. The magnitude of F is calculated according to the equation:

$$F = (3YId)/L^3, \text{ where } Y=\text{Young's modulus and } I=\text{moment of inertia}$$

Thus, to minimize the force required to cause a given displacement (i.e. for the post to be flexible), both Y and I need to be minimized. As far as Y is concerned, gold and solder are good choices although copper is to be preferred for other reasons, while I is proportional to the mass of the post, implying that a small diameter and low density are best.

Figure 2:
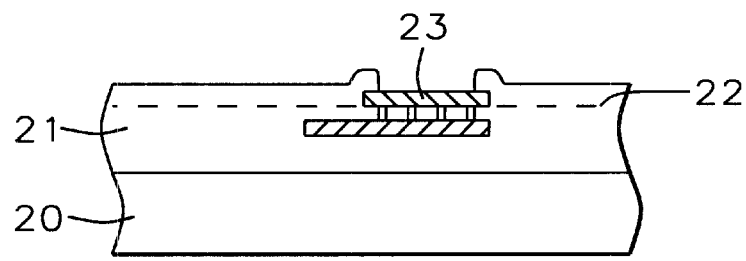
FIG. 2 shows parts of an integrated circuit prior to packaging.

We will now describe the three embodiments of the invention. Although these embodiments differ in their total approach they both share the following initial steps:

Referring now to FIG. 2, all embodiments begin with the provision of a semiconductor wafer in which multiple chips have been formed. Each such chip has an image on the surface of the wafer and each such chip image is separated from all others by a region known as the kerf because it will be used later by the saw blade for dicing the wafer into individual chips. Integrated circuit 21 is shown as having been formed over silicon substrate 20. Layer 22 represents a passivating layer similar to layer 13 in FIGS. 1a and 1b, while connecting pad 23 (corresponding to stud 7 in FIG. 1a) is seen as being open to the outside world.

First Embodiment

Figure 3:
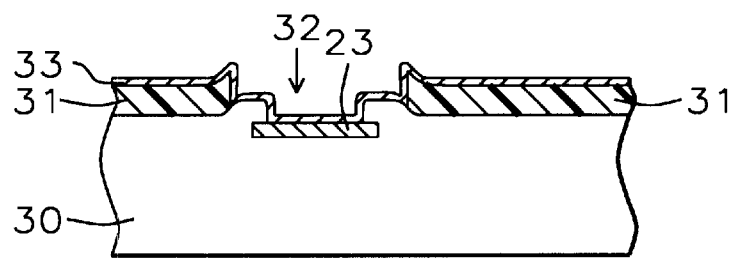
FIG. 3 shows the structure of FIG. 2 after the addition of a planarizing layer that includes an access hole to the studs as well as a contacting layer.

In FIG. 3, layer 30 represents everything in FIG. 2 below the pad 23, including layer 22. Layer 31 of polyimide has been deposited by spin coating onto the surface of 30 and opening 32 has been formed in it using standard photolithographic techniques, including photosensitive polyimides. Layer 31 is generally between about 3 and 20 microns thick. This is followed by the deposition of layer 33 of chrome-copper generally but not necessarily, by sputtering, to a thickness that is between about 500 and 2,000 Angstroms.

Figure 12:
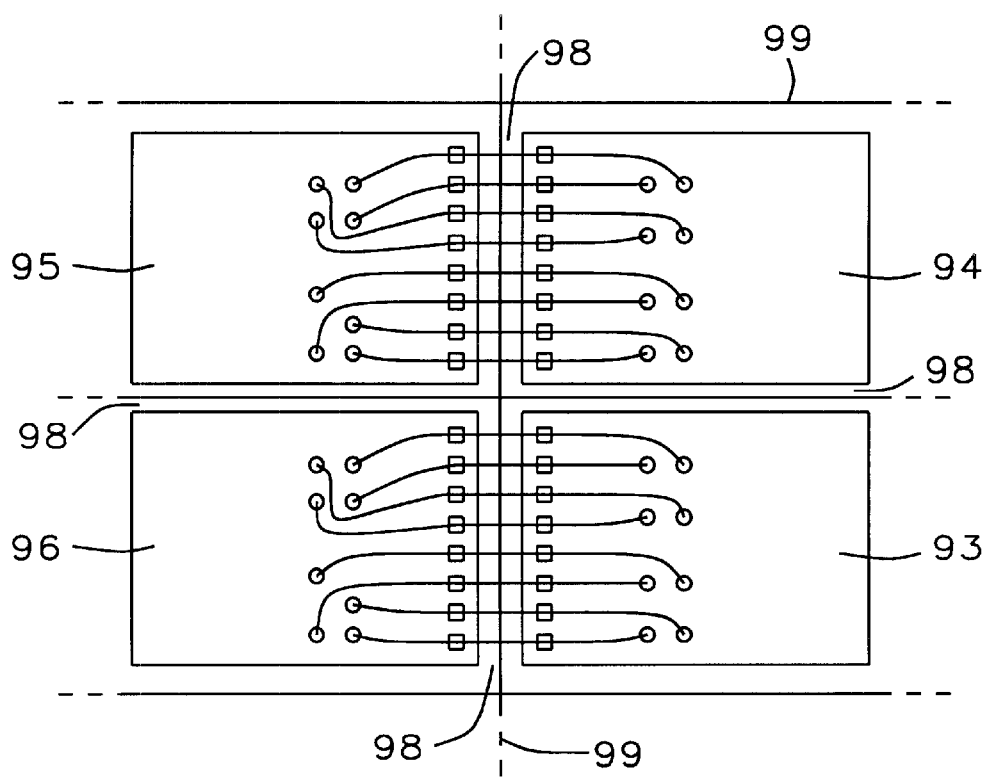
FIG. 12 shows how individual redistribution networks on chips may be connected together in the kerf to form a single common distribution network.

With layer 33 (in FIG. 3) covering the entire surface of the wafer, photoresist is laid down and patterned so that the surface is covered everywhere except where it is intended to have the redistribution network. In an important feature of the invention, the individual chip-level distribution networks are connected to one another by using the otherwise empty space provided by the kerf, thereby forming a common distribution network as illustrated in FIG. 12 where individual redistribution networks in chip images 93–96 are seen to be connected together in the kerf regions 98 thereby forming a common distribution network one end of which is designated as 99.

Figure 4:
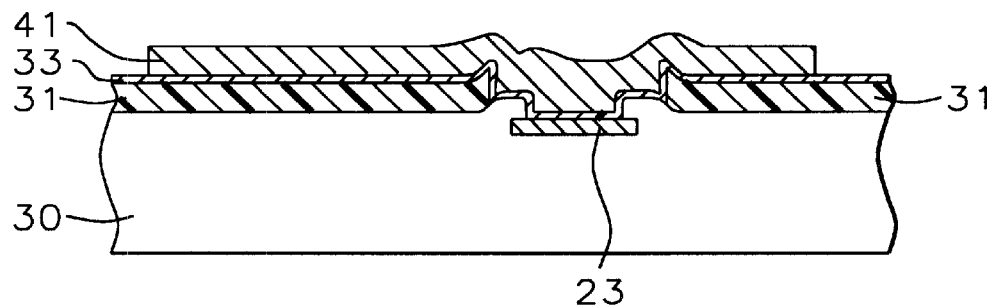
FIG. 4 shows the structure of FIG. 3 following the addition of a redistribution layer.

Electroplating is then used to build up the thickness of the metal that forms the common distribution network. Electrical contact is made to metal layer 33 allowing metal to be plated in all areas not covered by the photoresist. For this metal we have preferred to use copper although metals such as aluminum could also have been used together with non-electroplating methods. At the completion of electroplating, resulting in an additional thickness of metal between about 0.5 and 5 microns thick, the photoresist is removed. An example of part of the redistribution network is shown as layer 41 in FIG. 4 and all parts of the contacting layer not covered by the redistribution network are selectively removed.

Figure 5:
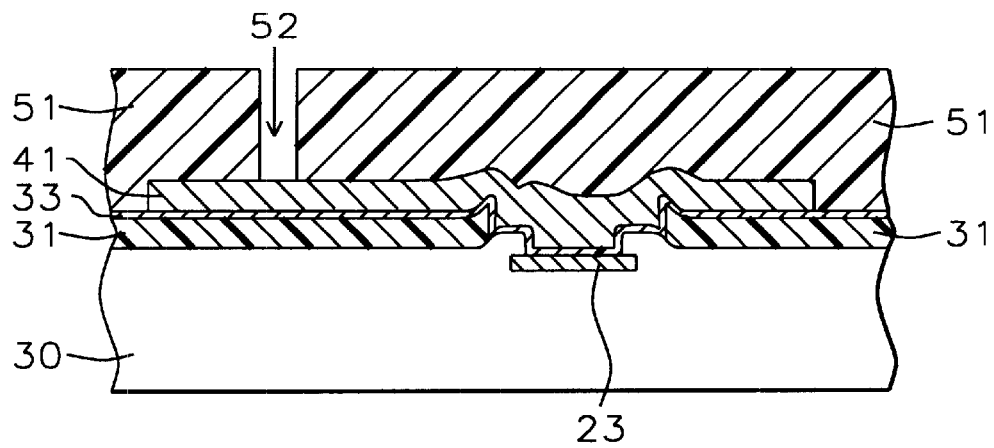
FIG. 5 shows structure of FIG. 4 following the addition of a layer of polymetric material in which a via hole has been formed.
Figure 11A:
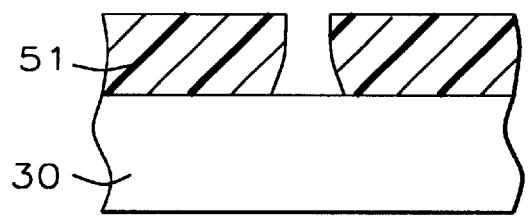
FIGS. 11a and 11b illustrate how the shape of a via hole formed in a photosensitive material may be modified depending on its properties and on the exposure mode used.
Figure 11B:
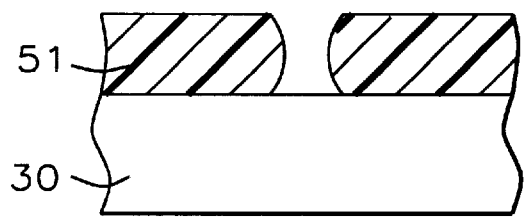

Next, a layer of polymeric material is laid down. This is shown as layer 51 in FIG. 5. Its thickness is between about 20 and 250 microns. Via hole 52 is then formed in it. This corresponds to via holes 11 in FIG. 1a. Several different subprocesses were available for the formation of this via hole:

(a) the polymeric material is photosensitive. In the case of BCB and the polyimides, there are many commercial compositions available for this. Via holes 52 are then formed by exposing through a suitable mask and developing. By controlling the type of photosensitive materials as well as the exposure conditions, the shape of the via holes can be controlled. For example, if the photosensitive material generates a negative image of the mask this can cause the via holes to be wider closest to their bottom, i.e. closest to layer 41 as illustrated in FIG. 11a. On the other hand, if the photosensitive material generates a positive image of the mask and if an imaging system with a low depth of focus is used and if the image is focused in a plane midway between the two surfaces, the effect is for the via holes to be narrowest at a point halfway down the holes, as illustrated in FIG. 11b. In general, the resulting conductive posts will have better strength and adhesion than conventional (simple cylindrical) posts.

(b) the polymeric material is etched in the usual way using a photoresist mask. Since the photoresist and the polymeric material respond somewhat similarly to the etchants usually used for the latter, a hard mask (e.g. CVD silicon oxide) is often used.

(c) the polymeric material is etched using laser drilling. For polymeric layers thicker than about 100 microns this is the preferred method. An example of a laser well suited to this application is an eximer (209 nm) laser or a $CO_2$ (10.6 microns) laser with the capability of forming holes with diameters as low as about 50 microns.

Figure 6:
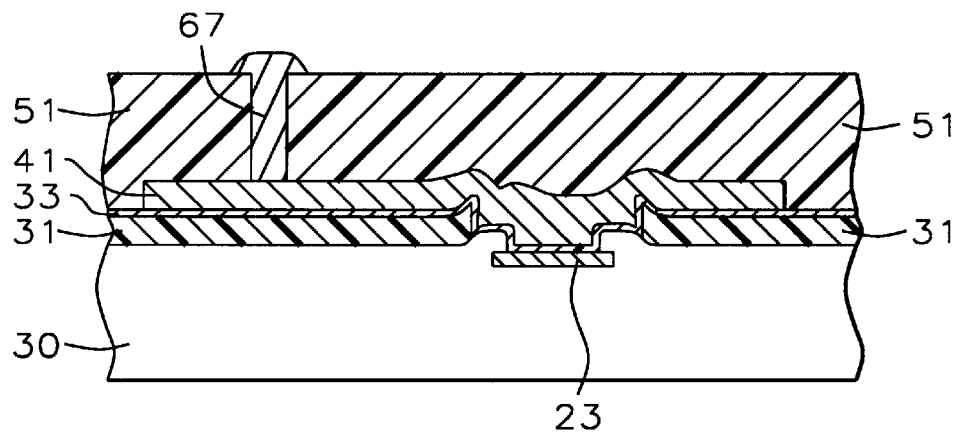
FIG. 6 is the structure seen in FIG. 5 after the via hole has been overfilled with metal to form a conducting post.

Then, using a second electroplating step (contact to layer 41 being made through the common distribution network), additional metal (preferably copper but other metals such as gold, solder (such as lead-tin), or aluminum (non-electroplated), could also have been used) was plated onto all exposed surfaces of layer 41. In other words, via hole 52 was filled with metal, with post formation being continued past the point at which it was just filled. Thus the appearance of the structure following the overfilling of via hole 52 approximated that shown schematically in FIG. 6 where stud 67 is seen to have a rounded top projecting above the surface of layer 51. This projection of the post above the polymeric material surface is needed to anchor the solder bumps which are grown in the next step of the process. This 'anchor' effect can be further enhanced by etching back the polyimide material to some extent, as illustrated in FIG. 7a, to generate a 'lollipop' structure for the post-bump combination.

Figure 7A:
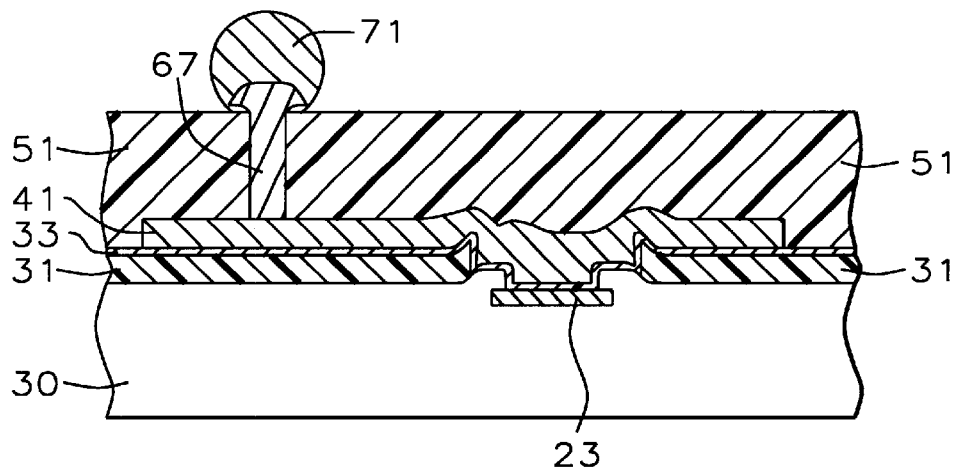
FIG. 7a shows the structure of FIG. 6 following the formation of a solder ball at the end of a projecting post together with etchback to form a 'lollipop' structure.

Referring now to FIG. 7a, a solder bump such as 71 is grown over the projecting tip of 67. Since electrical contact can still be made to 67 through the common distribution network, electroplating is the preferred method for accomplishing this. In general, electroplating offers better control, in particular control of the composition of the deposited layer, than is achievable by, for example, electroless plating.

Figure 7B:
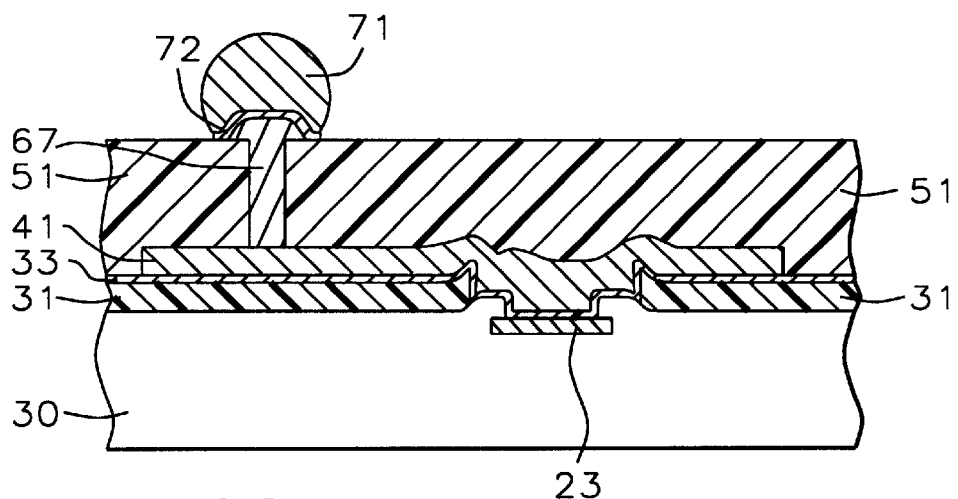
FIG. 7b is like FIG. 7a except that a layer of UBM has been inserted between the solder ball and the polymeric layer.

As a variation to this embodiment, the extensions of the posts may be first coated with a UBM layer 72 as shown in FIG. 7b prior to growing solder bump 71. This is done in the usual manner by first depositing over the entire surface and then patterning and etching. The advantage of providing this extra layer of UBM is that the base contact area for the solder balls is enlarged and hence their adhesion is increased. It would be used in cases where large solder balls are required. In both cases, the diameter of the solder bumps was between about 100 and 300 microns with a pitch that was typically between about 200 and 800 microns.

Once solder bumps 71 have been formed, the wafer is diced into individual chips by cutting along the kerf. In so doing the common distribution network is destroyed but each chip retains its own individual redistribution network.

Second Embodiment

Figure 8:
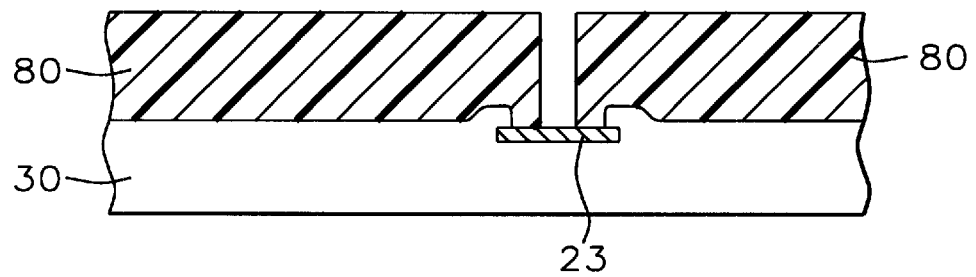
FIG. 8 shows the structure of FIG. 2 following the addition of a layer of polymetric material in which a via hole has been formed directly above the stud.

Unlike the first embodiment, there is no redistribution network present on the surface of the unpackaged chips. Therefore, the process proceeds directly from the structure of FIG. 2 to the step of laying down a layer of polymeric material 80 (as illustrated in FIG. 8) whose thickness is between about 20 and 250 microns. As in the first embodiment, via holes 82 are formed in it with the added constraint that they are located directly above studs 23. These correspond to the via holes that will contain conductive posts 11 in FIG. 1b. In order to form these via holes, one of three subprocesses were used:

(a) the polymeric material is photosensitive. In the case of polyimides or BCB, there are many commercial compositions available for this. Via holes 52 are then formed by exposing through a suitable mask and developing. By controlling the type of photosensitive material as well as the exposure conditions, the shape of the via holes can be controlled. For example, if the photosensitive material generates a negative image of the mask this can cause the via holes to be wider closest to their bottom, i.e. closest to layer 41 as illustrated in FIG. 11a. On the other hand, if the photosensitive material generates a positive image of the mask and if an imaging system with a low depth of focus is used and if the image is focused in a plane midway between the two surfaces, the effect is for the via holes to be narrowest at a point halfway down the holes as illustrated in FIG. 11b.

(b) the polymeric material is etched in the usual way using a photoresist mask. Since the photoresist and the polymeric material respond somewhat similarly to the etchants usually used for the latter, a hard mask (e.g. CVD silicon oxide) is often used.

(c) the polymeric material is etched using laser drilling. For polymeric layers thicker than about 100 microns this is the preferred method. An example of a laser well suited to this application is an eximer (209 nm) laser or a $CO_2$(10.6 microns) laser with the capability of forming holes with diameters as low as about 50 microns.

Then, using electroless plating, (electrical contact to I/O pads such as 6 or 7 not being available in this embodiment), additional metal (preferably copper but other metals such as gold, solder, or nickel could also have been used) was plated onto all exposed surfaces of studs 23. In other words, via hole 82 was filled with metal.

Figure 9:
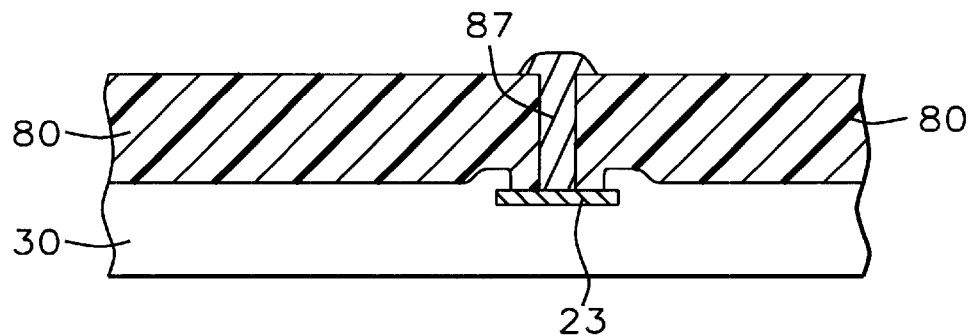
FIG. 9 is the structure seen in FIG. 8 after the via hole has been overfilled with metal to form a conducting post.

The filling of 82 was continued past the point at which it was just filled. Thus the appearance of the structure following the overfilling of via hole 82 approximated that shown schematically in FIG. 9 where post 87 is seen to have a rounded top projecting above the surface of layer 80. As in the first embodiment, this projection of the post above the polymeric material surface is needed to anchor the solder bumps which are grown in the next step of the process.

Figure 10A:
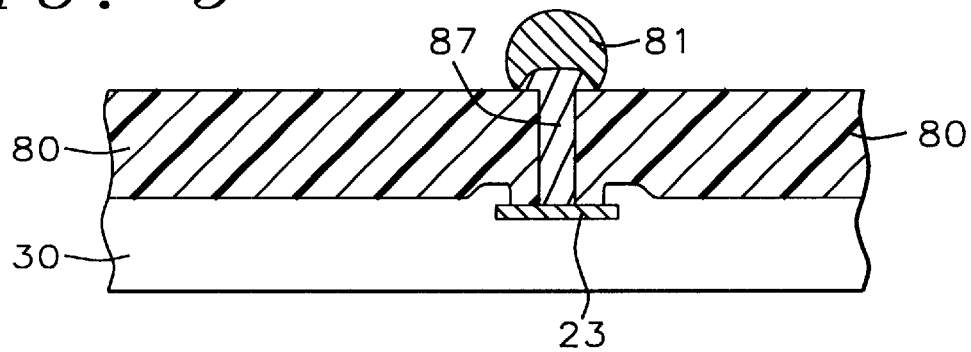
FIG. 10a shows the structure of FIG. 9 following the formation of a solder ball at the end of a projecting post.

Referring now to FIG. 10a, a solder bump 81 is grown over the projecting tip of 87. Since electrical contact cannot be made to 87, electroless plating has to be used.

Figure 10B:
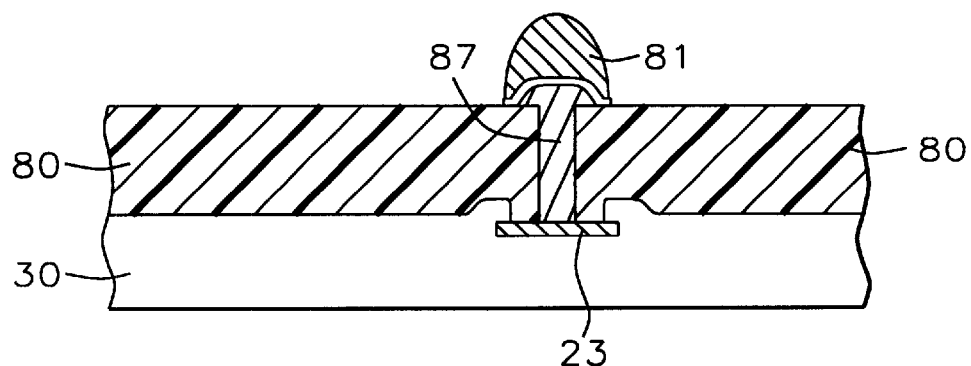
FIG. 10b is like FIG. 10a except that a layer of UBM has been inserted between the solder ball and the polymeric layer.

As a variation to this embodiment, the extensions of the posts may be first coated with a UBM layer 88 (as shown in FIG. 10b) prior to growing solder bump 81. This is done in the usual manner by first depositing over the entire surface and then patterning and etching. The advantage of providing this extra layer of UBM is that the base contact area for the solder balls is enlarged and hence their adhesion is increased. It would be used in cases where large solder balls are required. In both cases, the diameter of the solder bumps was between about 100 and 300 microns with a pitch that was typically between about 200 and 800 microns.

As an alternative, low cost, variation, instead of forming the solder bumps through plating, they may be laid down by means of screen printing or stenciling. This is a viable approach for solder bumps having diameters in excess of about 100 microns with a pitch that is greater than about 200 microns.

Once solder bumps 81 have been formed, the wafer is diced into individual chips by cutting along the kerf.

Third Embodiment

Figure 13:
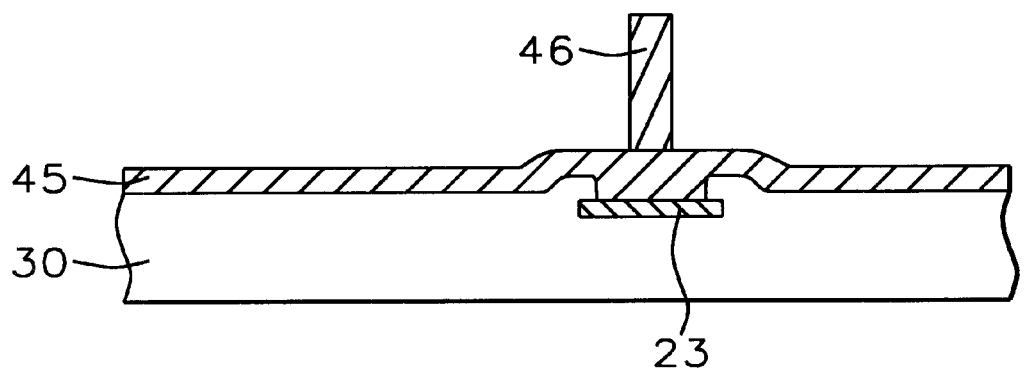
FIG. 13 shows a freestanding post which is to be almost covered by a layer of polymeric material.

As in the second embodiment, there is no redistribution network present on the surface of the unpackaged chips. However, unlike the second embodiment, the preferred metal deposition method is electroplating. Accordingly, a contacting metal layer is deposited over the entire passivation layer. See layer 45 in FIG. 13. This is followed by coating with a layer a photoresist in which via holes are formed in a similar manner to the formation of via holes in the photosensitive versions of the polymers as described in the first and second embodiments, including techniques for controlling the shapes of these via holes. The via holes are then filled with metal by means of electroplating following which the photoresist is stripped, leaving behind freestanding metal posts such as 46 in FIG. 13.

Then, using a differential etch, the contacting layer is removed without any attack on the freestanding posts. Next, the polymeric material is applied to the wafer as a single layer whose thickness is less than the height of the freestanding posts, thereby allowing a certain amount of uncovered post material to project above the surface of the polymer. The structure is then completed as in the second embodiment through the formation of solder bumps by electroless plating, screen printing, or stenciling.

While the invention has been particularly shown and described with reference to the preferred embodiments thereof, it will be understood by those skilled in the art that various changes in form and details may be made without departing from the spirit and scope of the invention.

What is claimed is:

1. A wafer scale package, comprising:

a semiconductor wafer, including chip images separated by a kerf area and having a topmost passivating layer through which pass connecting studs;

a polymeric body having a plurality of metal posts in contact with, and fixed to, said connecting studs and passing vertically through said polymeric body from said studs;

wherein said posts are of a diameter and height and of a material that they can bend to absorb stress due to thermal mismatch between said semiconductor wafer and said polymeric body; and wherein a bending force exerted at a free end of a metal post of length L, displaced by an amount d, is according to a formula $F=(3YId)/L^3$, where Y=Young's modulus and I=moment of inertia.

2. The package of claim 1 wherein said polymeric body is a polyimide or a silicone elastomer or benzocyclobutene.

3. The package of claim 1 wherein said polymeric body has a thickness between about 20 and 250 microns.

4. The package of claim 1 wherein said metal posts have a width between about 10 and 200 microns.

5. The package of claim 1 wherein said metal posts are plated copper.

6. A wafer scale package, comprising:

a semiconductor wafer, including chip images separated by a kerf area and having a topmost passivating layer through which pass connecting studs;

a body of silicone elastomer on said topmost passivating layer, having a plurality of metal posts in contact with, and fixed to, said connecting studs and passing vertically through said body of silicone elastomer from said studs;

said posts being of a diameter and height and of a material such that they can bend to absorb stress due to thermal mismatch between said semiconductor wafer and said body of silicone elastomer; and wherein said body of silicon elastomer can also absorb stress due to said thermal mismatch.

* * * * *

UNITED STATES PATENT AND TRADEMARK OFFICE
CERTIFICATE OF CORRECTION

PATENT NO. : 6,486,563 B1
DATED : November 26, 2002
INVENTOR(S) : Mou-Shiung Lin It is certified that error appears in the above-identified patent and that said Letters Patent is hereby corrected as shown below:

Title page,
Item, [73], Assignee, delete "Megic Corporation, Hsin-Chu (TW)", there should be no assignee.

Signed and Sealed this

Twenty-first Day of December, 2004

JON W. DUDAS
*Director of the United States Patent and Trademark Office*